United States Patent
Choi

(10) Patent No.: US 11,276,475 B2
(45) Date of Patent: Mar. 15, 2022

(54) MEMORY DEVICE AND METHOD OF OPERATING THE MEMORY DEVICE

(71) Applicant: SK hynix Inc., Icheon-si (KR)

(72) Inventor: Hyung Jin Choi, Icheon-si (KR)

(73) Assignee: SK hynix Inc., Icheon-si (KR)

(\*) Notice: Subject to any disclaimer, the term of this patent is extended or adjusted under 35 U.S.C. 154(b) by 0 days.

(21) Appl. No.: 17/084,204

(22) Filed: Oct. 29, 2020

(65) Prior Publication Data

US 2021/0407606 A1   Dec. 30, 2021

(30) Foreign Application Priority Data

Jun. 26, 2020  (KR) ................. 10-2020-0078371

(51) Int. Cl.
| | | |
|---|---|---|
| G11C 11/00 | (2006.01) | |
| G11C 16/34 | (2006.01) | |
| G11C 16/10 | (2006.01) | |
| G11C 16/24 | (2006.01) | |
| G11C 11/56 | (2006.01) | |
| G11C 16/04 | (2006.01) | |

(52) U.S. Cl.
CPC ......... *G11C 16/3459* (2013.01); *G11C 16/10* (2013.01); *G11C 16/24* (2013.01); *G11C 11/56* (2013.01); *G11C 16/0483* (2013.01)

(58) Field of Classification Search
CPC ..... G11C 16/0483; G11C 16/08; G11C 16/10; G11C 16/30; G11C 16/26; G11C 29/42; G11C 7/222; G11C 8/18; G11C 16/14; G11C 11/40615; G11C 11/4085; G11C 11/4094; G11C 11/4096; G11C 7/1057; G11C 7/1084; G11C 11/4074; G11C 11/408; G11C 29/12005
See application file for complete search history.

(56) References Cited

U.S. PATENT DOCUMENTS

| | | | | |
|---|---|---|---|---|
| 2016/0336071 A1* | 11/2016 | Park | ..................... | G11C 16/12 |
| 2017/0140813 A1* | 5/2017 | Gwon | ................ | G11C 16/0483 |
| 2020/0143886 A1* | 5/2020 | Lee | ....................... | G06F 3/0659 |

FOREIGN PATENT DOCUMENTS

| | | |
|---|---|---|
| KR | 1020110033222 A | 3/2011 |
| KR | 1020170102659 A | 9/2017 |

\* cited by examiner

*Primary Examiner* — Hien N Nguyen
(74) *Attorney, Agent, or Firm* — William Park & Associates Ltd.

(57) ABSTRACT

Provided herein may be a memory device and a method of operating the memory device. The memory device may include a memory block coupled to bit lines and word lines, a voltage generator configured to apply at least one of a program voltage or a verify voltage to a word line selected from among the word lines, page buffers configured to precharge less than all or all of the bit lines during a verify operation performed on the memory cells, an operation logic configured to output verify information related to a verify operation performed during a program operation in response to a command, and a page buffer controller configured to output page buffer control signals so that the less than all of the bit lines are selectively precharged or the all of the bit lines are precharged depending on the verify information.

19 Claims, 14 Drawing Sheets

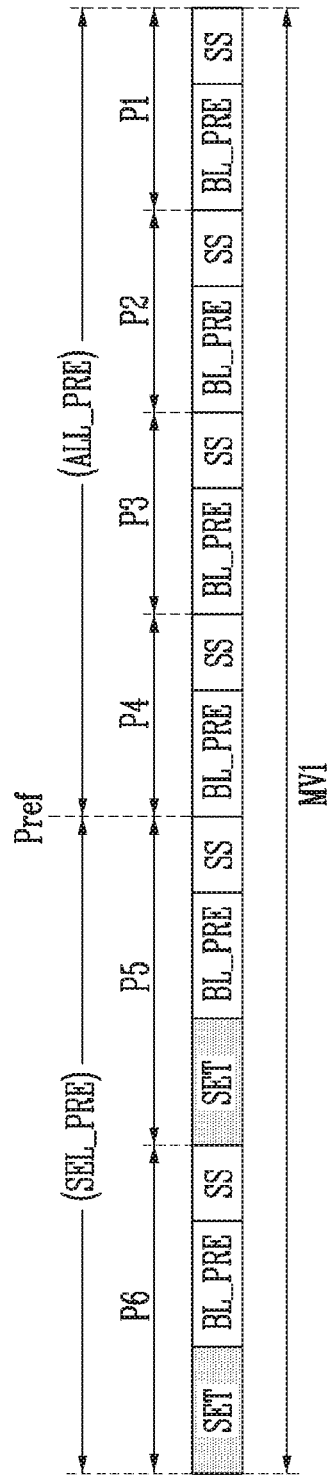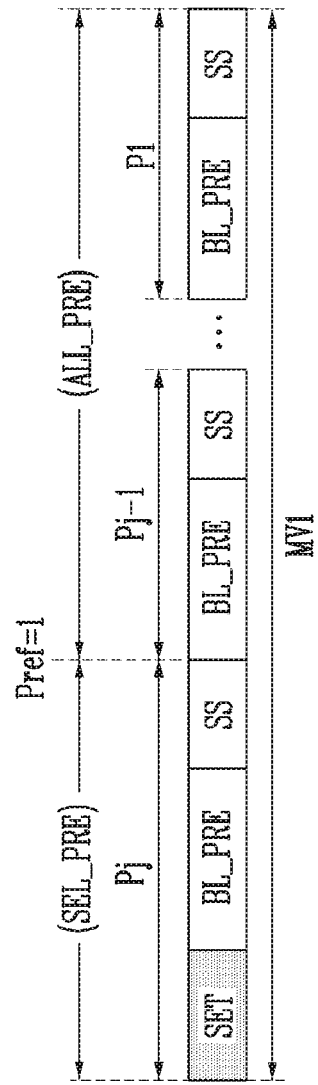

MEMORY DEVICE AND METHOD OF OPERATING THE MEMORY DEVICE

CROSS-REFERENCE TO RELATED APPLICATION

The present application claims priority under 35 U.S.C. § 119(a) to Korean patent application number 10-2020-0078371, filed on Jun. 26, 2020, in the Korean Intellectual Property Office, the entire disclosure of which is incorporated herein by reference.

BACKGROUND

1. Technical Field

Various embodiments of the present disclosure relate to a memory device and a method of operating the memory device, and more particularly to a method device that is capable of performing program and verify operations on memory cells, and a method of operating the memory device.

2. Related Art

A memory device may include a memory block in which data is stored, peripheral circuits which can perform a program operation, a read operation or an erase operation on the memory block, and a logic circuit which can control the peripheral circuits.

A program operation may include a sub-program operation of increasing the threshold voltages of memory cells included in the memory block and a verify operation of determining whether the threshold voltages of the memory cells have increased up to target voltages. The program operation may be performed in an incremental step pulse program (ISPP) manner in which a program voltage to be applied to a word line coupled to memory cells is increased in steps. For example, the sub-program operation and the verify operation may form a single loop, and a plurality of loops may be performed during the program operation. Whenever each program loop is performed, the program voltage may be increased by a step voltage.

A read operation may include an operation of sensing memory cells using a read voltage and an operation of outputting data sensed from the memory cells to an external device. Here, the external device may be a controller which transmits a command and an address to the memory device.

An erase operation may be an operation which causes the memory cells included in the memory block to be in an erased state. For example, the erase operation may include an operation of applying an erase voltage to all memory cells included in the memory block and an erase verify operation of determining whether the threshold voltages of the memory cells are in an erased state.

SUMMARY

An embodiment of the present disclosure may provide for a memory device. The memory device may include a memory block coupled to bit lines and word lines, the memory block may include a plurality of memory cells, a voltage generator configured to apply at least one of a program voltage and a verify voltage to a word line selected from among the word lines, page buffers configured to precharge one of all of the bit lines and less than all of the bit lines during a sub verify operation performed on the memory cells, an operation logic configured to output verify information related to a verify operation performed during a program operation in response to a command, and a page buffer controller configured to output page buffer control signals so that one of the less than all of the bit lines are selectively precharged and the all of the bit lines are precharged depending on the verify information.

An embodiment of the present disclosure may provide for a method of operating a memory device. The method may include increasing threshold voltages of memory cells, and performing a main verify operation of verifying the memory cells, wherein the main verify operation includes a plurality of sub-verify operations that use different verify voltages, and wherein, during sub-verify operations having an order which is within a range of the reference number of verify operations, among the sub-verify operations, bit lines are selectively precharged and then a sensing operation is performed, and during sub-verify operations having an order which is greater than or less than the range of the reference number of verify operations, all of the bit lines are precharged and then the sensing operation is performed.

An embodiment of the present disclosure may provide for a method of operating a memory device. The method may include performing a first sub-verify operation of selectively precharging bit lines depending on data stored in page buffers and of verifying threshold voltages of memory cells, and performing a second sub-verify operation of simultaneously precharging the bit lines regardless of the data stored in the page buffers and of verifying threshold voltages of the memory cells.

BRIEF DESCRIPTION OF THE DRAWINGS

FIG. 18 is a diagram illustrating a verify operation according to third embodiments of the present disclosure.

FIG. 19 is a diagram illustrating a verify operation according to fourth embodiments of the present disclosure.

DETAILED DESCRIPTION

Various embodiments of the present disclosure may be directed to a memory device that is capable of adjusting program operation time and current consumption during a program operation of the memory device, and a method of operating the memory device.

Figure 1:
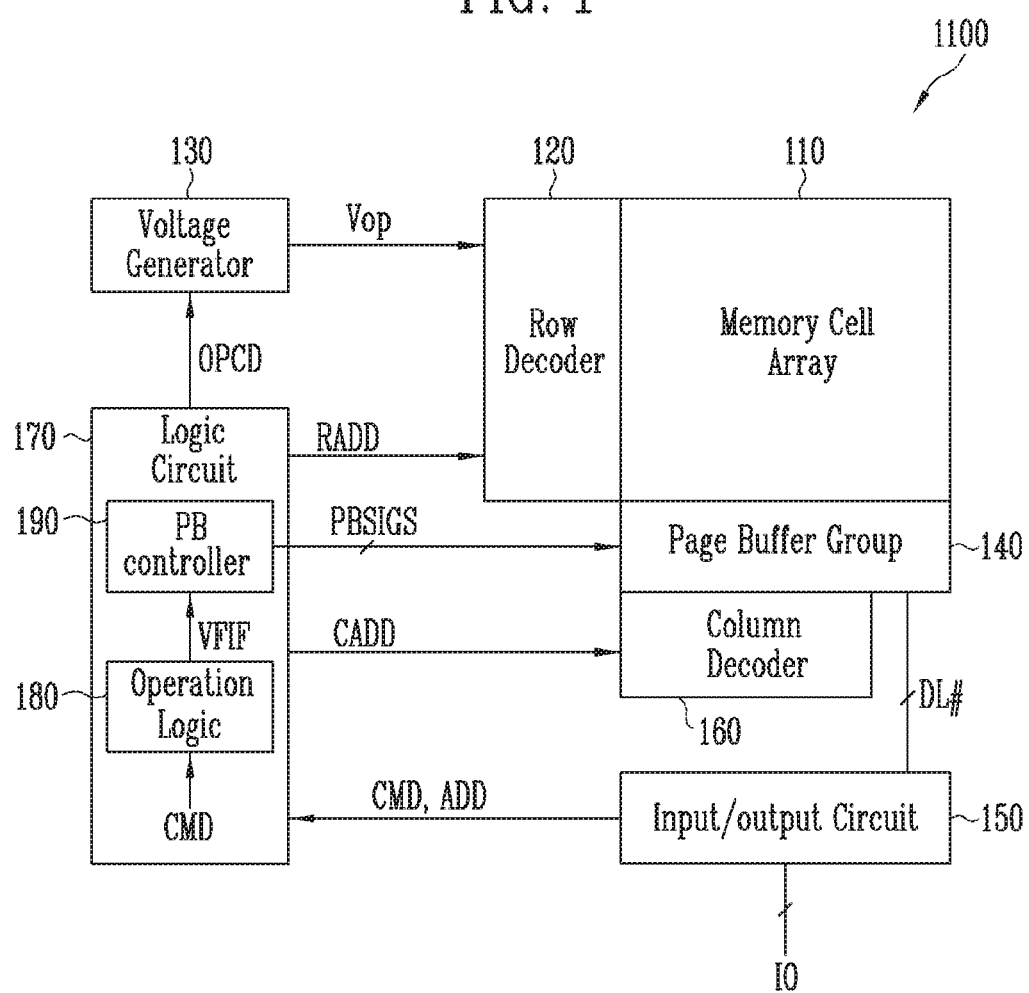
FIG. 1 is a diagram illustrating a memory device according to an embodiment of the present disclosure.

FIG. 1 is a diagram illustrating a memory device according to an embodiment of the present disclosure.

Referring to FIG. 1, a memory device 1100 may include a memory cell array 110, a row decoder 120, a voltage generator 130, a page buffer group 140, an input/output circuit 150, a column decoder 160, and a logic circuit 170.

The memory cell array 110 may include a plurality of memory blocks in which data is stored. Each of the memory blocks may include a plurality of memory cells, which may be implemented in a two-dimensional (2D) structure in which memory cells are horizontally arranged on a substrate or in a three-dimensional (3D) structure in which memory cells are vertically stacked on a substrate.

The row decoder 120 may select one memory block from among the memory blocks included in the memory cell array 110 in response to a row address RADD transfer operating voltages Vop, and may transmit operating voltages Vop to the selected memory block.

The voltage generator 130 may generate and output the operating voltages Vop required for various operations in response to an operation code OPCD. For example, the voltage generator 130 may generate and output a program voltage, a verify voltage, a read voltage, an erase voltage, a pass voltage, etc.

The page buffer group 140 may be coupled to the memory cell array 110 through bit lines. For example, the page buffer group 140 may include page buffers coupled to respective bit lines. The page buffers may be simultaneously operated in response to page buffer control signals PBSIGS, and may temporarily store data during a program or read operation. A verify operation performed in a program operation and an erase verify operation performed in an erase operation may be conducted in the same manner as a read operation. During a verify operation, the page buffers may precharge the bit lines to sense the threshold voltages of the memory cells, and may sense data from the memory cells depending on the voltages or currents of the bit lines. The words "simultaneous" and "simultaneously" as used herein with respect to occurrences mean that the occurrences take place on overlapping intervals of time. For example, if a first occurrence takes place over a first interval of time and a second occurrence takes place simultaneously over a second interval of time, then the first and second intervals at least partially overlap each other such that there exists a time at which the first and second occurrences are both taking place.

The input/output circuit 150 may couple the memory device 1100 to an external device through input/output lines IO. Here, the external device may be a controller that is capable of controlling the memory device 1100. The input/output circuit 150 may receive a command CMD, an address ADD, and data from the external device or output data to the external device through the input/output lines IO, and may receive data from the page buffer group 140 through data lines DL #. The input/output circuit 150 may transmit the command CMD and the address ADD, which are received through the input/output lines IO, to the logic circuit 170, and may transmit the data to the page buffer group 140.

The column decoder 160 may couple the page buffer group 140 to the data lines DL # in response to a column address CADD, thus enabling data to be transmitted between the page buffer group 140 and the input/output circuit 150 through the data lines DL #.

The logic circuit 170 may output the operation code OPCD, the row address RADD, the page buffer control signals PBSIGS, and the column address CADD in response to the command CMD and the address ADD. For example, the logic circuit 170 may include software which executes algorithms for various operations in response to the command CMD and hardware which outputs various signals depending on the address ADD and the algorithms. For example, the logic circuit 170 may include an operation logic 180 and a page buffer (PB) controller 190.

The operation logic 180 may be implemented as software which can execute algorithms in response to the command CMD. When the command CMD for a program operation is input, the operation logic 180 according to an embodiment may execute algorithms related to a sub-program operation and a verify operation, and may output verify information VFIF related to the verify operation. For example, the verify information VFIF may include information about the number of loops (i.e., loop count) and a change in a verify voltage.

The page buffer controller 190 may adjust the page buffer control signals PBSIGS depending on the verify information VFIF. For example, the page buffer controller 190 may precharge the bit lines based on a selective precharge scheme in which only some bit lines are precharged while the number of changes in verify voltages, among the plurality of verify voltages used in the same loop, falls within the range of the reference number of verify operations. Further, the page buffer controller 190 may precharge the bit lines based on a non-selective precharge scheme in which all bit lines are precharged when the number of changes in verify voltages has reached the reference number of verify operations. In the selective precharge scheme, current consumption may be reduced during the verify operation, but program operation time (i.e., time required for the program operation) may be lengthened. In the non-selective precharge scheme, current consumption may be increased during the verify operation, but the program operation time may be shortened.

Therefore, in an embodiment, in order to optimize the time for the program operation time and current consumption, the number of verify operations performed in each loop is compared with the reference number of verify operations, and thus the selective precharge scheme may be used for some periods and the non-selective precharge scheme may be used for the remaining periods based on the result of the comparison.

Figure 2:
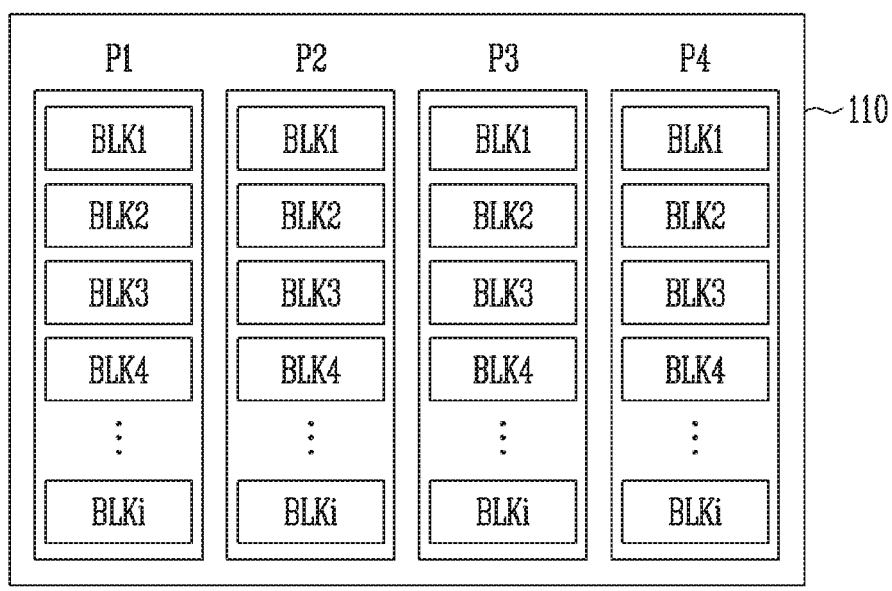
FIG. 2 is a diagram illustrating a memory cell array.

FIG. 2 is a diagram illustrating a memory cell array.

Referring to FIG. 2, the memory cell array 110 may be implemented as a single-plane structure or a multi-plane structure. The single-plane structure may be a structure in which the memory cell array 110 is implemented as a single plane, and the multi-plane structure may be a structure in which multiple planes are included in the memory cell array 110. In FIG. 2, the memory cell array 110 having a multi-plane structure is illustrated.

The memory cell array 110 may include first to fourth planes P1 to P4. Different row decoders and different page buffers may be coupled to the first to fourth planes P1 to P4. Each of the first to fourth planes P1 to P4 may include a plurality of memory blocks BLK1 to BLKi (where i is a positive integer). Different physical addresses may be allocated to the first to fourth planes P1 to P4, and different physical addresses may also be allocated to the plurality of memory blocks BLK1 to BLKi.

The first to fourth planes P1 to P4 may be simultaneously selected during a program, a read or an erase operation, and memory blocks selected from the first to fourth planes P1 to P4 may be identical to or different from each other depending on the row address. For example, depending on the row address, the first memory block BLK1 of the first plane P1 may be selected, the third memory block BLK3 of the second plane PL2 may be selected, the second memory block BLK2 of the third plane P3 may be selected, and the first memory block BLK1 of the fourth plane P4 may be selected.

For example, during a program operation, when data is input to the page buffers respectively coupled to the first to fourth planes P1 to P4, the program operation may be simultaneously performed on the selected memory blocks of the first to fourth planes P1 to P4. During a read operation, the read operation may be simultaneously performed on the selected memory blocks of the first to fourth planes P1 to P4. During an erase operation, the erase operation may be simultaneously performed on the selected memory blocks of the first to fourth planes P1 to P4.

Figure 3:
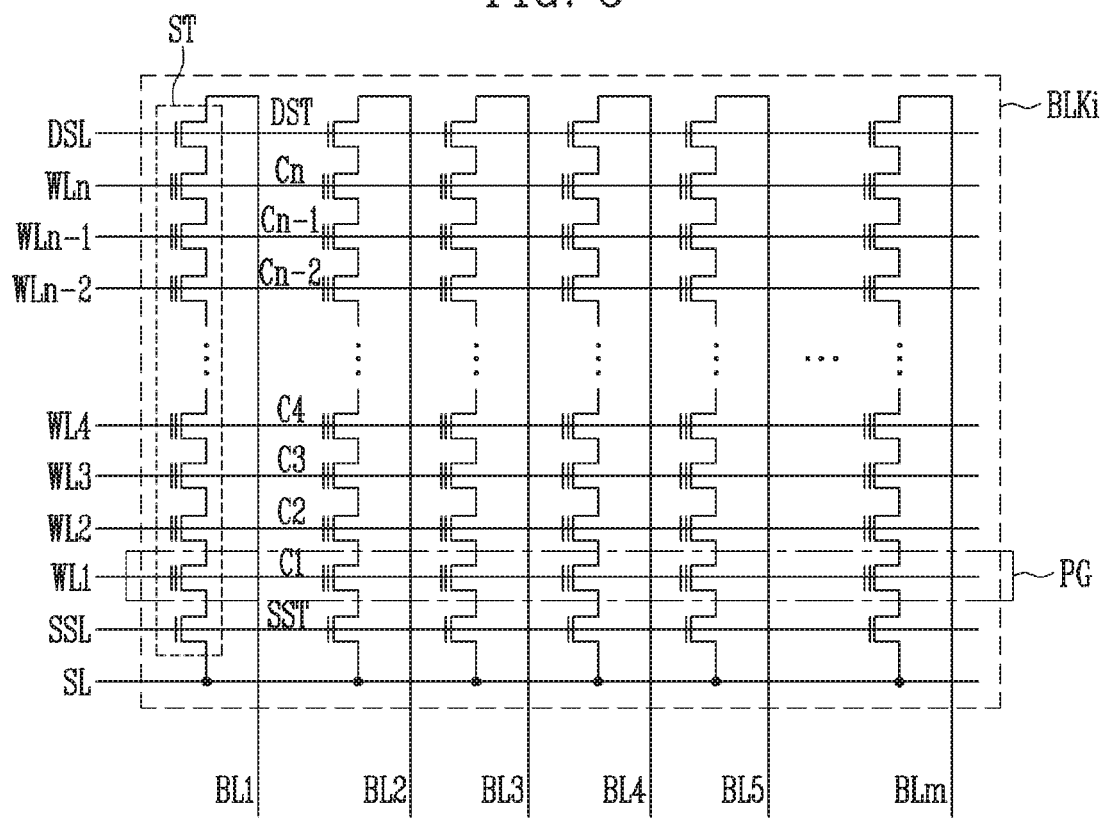
FIG. 3 is a diagram illustrating a memory block.

FIG. 3 is a diagram illustrating a memory block.

Referring to FIG. 3, any one memory block BLKi, among a plurality of memory blocks BLK1 to BLKi illustrated in FIG. 2, is illustrated by way of example.

The memory block BLKi may include a plurality of strings ST coupled between first to m-th bit lines BL1 to BLm (where m is a positive integer) and a source line SL. Each of the strings ST may include a source select transistor SST, first to n-th memory cells C1 to Cn, and a drain select transistor DST which are coupled in series between the source line SL and a corresponding one of the first to m-th bit lines BL1 to BLm.

Since the memory block BLKi illustrated in FIG. 3 is intended to explain the configuration of the memory block, the numbers of source select transistors SST, first to n-th memory cells C1 to Cn, and drain select transistors DST are not limited to those illustrated in FIG. 3.

Respective gates of source select transistors SST coupled to different strings ST may be coupled to a source select line SSL, respective gates of the first to n-th memory cells C1 to Cn may be coupled to first to n-th word lines WL1 to WLn, and respective gates of the drain select transistors DST may be coupled to a drain select line DSL.

A group of memory cells coupled to the same word line and included in different strings ST may form one page PG. A program operation may be performed on a page (PG) basis. For example, a sub-program operation and a verify operation may be performed on a page (PG) basis. For example, after a sub-program operation has been performed on a selected page, a verify operation may be performed on the selected page.

Figure 4:
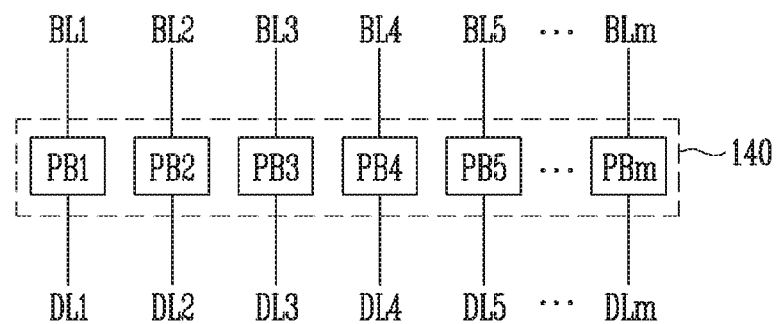
FIG. 4 is a diagram illustrating a page buffer group.

FIG. 4 is a diagram illustrating a page buffer group.

Referring to FIG. 4, the page buffer group 140 may include first to m-th page buffers PB1 to PBm (where m is a positive integer). The first to m-th page buffers PB1 to PBm may be coupled between first to m-th bit lines BL1 to BLm and first to m-th data lines DL1 to DLm, respectively. The first to m-th page buffers PB1 to PBm may sequentially store data loaded onto the first to m-th data lines DL1 to DLm or sequentially output the stored data to the first to m-th data lines DL1 to DLm.

Figure 5:
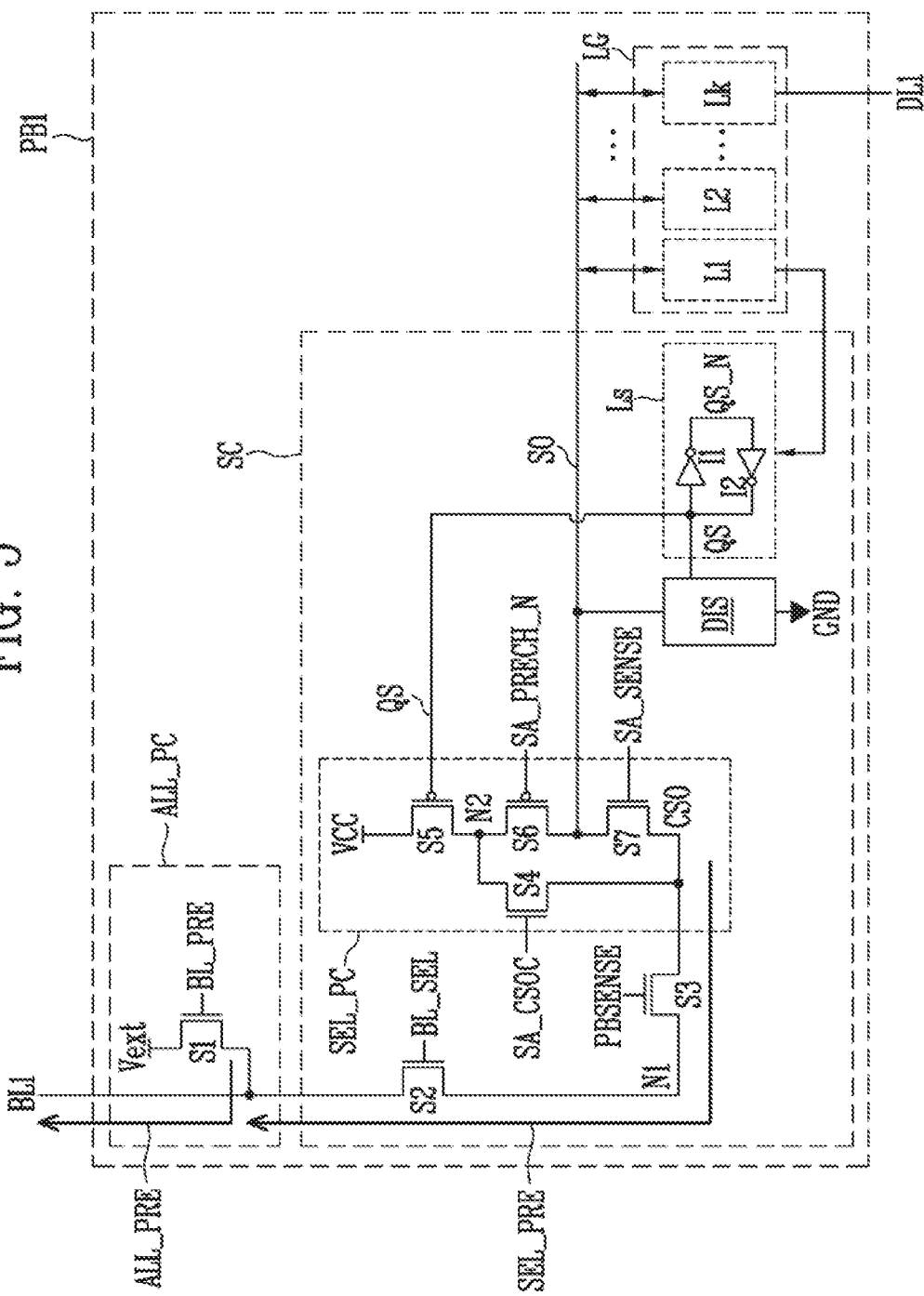
FIG. 5 is a diagram illustrating a page buffer included in a page buffer group.

FIG. 5 is a diagram illustrating a page buffer included in a page buffer group, and shows a part of the first page buffer PB1, among the first to m-th page buffers PB1 to PBm illustrated in FIG. 4, by way of example.

Referring to FIG. 5, the first page buffer PB1 may include a non-selective precharge circuit ALL_PC, a sensing circuit SC, and a latch group LG.

The non-selective precharge circuit ALL_PC may precharge a first bit line BL1 in response to a bit line precharge signal BL_PRE during a verify operation. For example, the non-selective precharge circuit ALL_PC may include a first switch S1 which transmits an external positive voltage Vext to the first bit line BL1 in response to the bit line precharge signal BL_PRE. The first switch S1 may be implemented as an NMOS transistor. The non-selective precharge circuit ALL_PC may perform a non-selective precharge operation ALL_PRE.

During a verify operation, the sensing circuit SC may selectively precharge the first bit line BL1 depending on data stored in a sensing latch Ls, and may sense the voltage or current of the first bit line BL1. For example, the sensing circuit SC may include second to seventh switches S2 to S7 and the sensing latch Ls. Among these components, the fourth to seventh switches S4 to S7 may be included in a selective precharge circuit SEL_PC. The sensing circuit SC is described in detail below.

The second switch S2 may be implemented as an NMOS transistor which transmits the voltage of a first node N1 to the first bit line BL1 or transmits the voltage of the first bit line BL1 to the first node N1 in response to a bit line select signal BL_SEL. The bit line select signal BL_SEL may be disabled when the bit line precharge signal BL_PRE is activated.

The third switch S3 may be implemented as an NMOS transistor, a turn-on level of which is adjusted in response to the level of a page sensing signal PBSENSE, and may be coupled between the first node N1 and a current sensing node CSO.

The selective precharge circuit SEL_PC may include the fourth to seventh switches S4 to S7.

The fourth switch S4 may be implemented as an NMOS transistor which couples or decouples a second node N2 to or from the current sensing node CSO in response to a current sensing signal SA_CSOC. The fifth switch S5 may be implemented as a PMOS transistor which is turned on or off depending on data of a sensing latch node QS, and may be coupled between a terminal, to which a supply voltage VCC is applied, and the second node N2. The sixth switch S6 may be implemented as a PMOS transistor which couples or decouples the second node N2 to or from the sensing node SO in response to a sensing precharge signal SA_PRECH_N. The seventh switch S7 may be implemented as an NMOS transistor which couples or decouples the sensing node SO to or from the current sensing node CSO in response to a sensing node sensing signal SA_SENSE.

During a selective precharge operation SEL_PRE, the fourth, sixth, and seventh switches S4, S6, and S7 may be turned on, and the fifth switch S5 may be turned on or off depending on the data of the sensing latch node QS. Therefore, during the selective precharge operation SEL_PRE, the supply voltage VCC or a ground voltage GND may be applied to the current sensing node CSO depending on the data of the sensing latch node QS.

When the non-selective precharge circuit ALL_PC is activated, the current sensing signal SA_CSOC may be disabled, whereas when the non-selective precharge circuit ALL_PC is deactivated, the current sensing signal SA_CSOC may be enabled. In an embodiment, non-selective precharge circuit ALL_PC is deactivated when the selective precharge circuit SEL_PC or the discharge circuit DIS is activated.

A discharge circuit DIS may selectively discharge the sensing node SO depending on the data of the sensing latch node QS. For example, when the data of the sensing latch node QS is '1', the discharge circuit DIS may be activated, and thus the sensing node SO may be discharged. When the data of the sensing latch node QS is '0', the discharge circuit DIS may be deactivated, and thus the sensing node SO might not be discharged. Here, data '1' may mean the state in which the potential of the sensing latch node QS is high, and data '0' may mean the state in which the potential of the sensing latch node QS is low.

The sensing latch Ls may include first and second inverters I1 and I2 coupled in parallel between the sensing latch node QS and an inverted sensing latch node QS_N. For example, an input terminal of the first inverter I1 and an output terminal of the second inverter I2 may be coupled to the sensing latch node QS, and an output terminal of the first inverter I1 and an input terminal of the second inverter I2 may be coupled to the inverted sensing latch node QS_N. The fifth switch S5 may be turned on or off depending on the data of the sensing latch node QS.

The latch group LG may include first to k-th latches L1 to Lk in which data can be stored. For example, the first to k-th latches L1 to Lk may be coupled to the sensing node SO through transfer switches (not illustrated), and may transmit data to each other through the sensing node SO and the transfer switches (not illustrated).

Among the first to k-th latches L1 to Lk, the k-th latch Lk may receive or output data through the first data line DL1, and may transmit data, stored in the first latch L1, to the sensing latch Ls. For example, in the first latch L1, data sensed in a previous verify operation may be stored.

Figure 6:
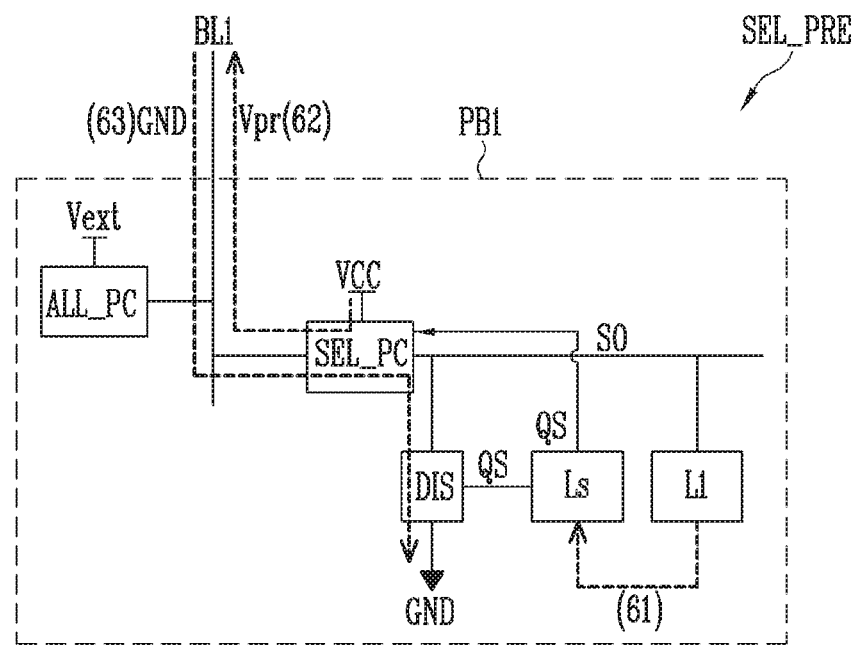
FIGS. 6 and 7 are diagrams illustrating a selective precharge operation according to an embodiment of the present disclosure.
Figure 7:
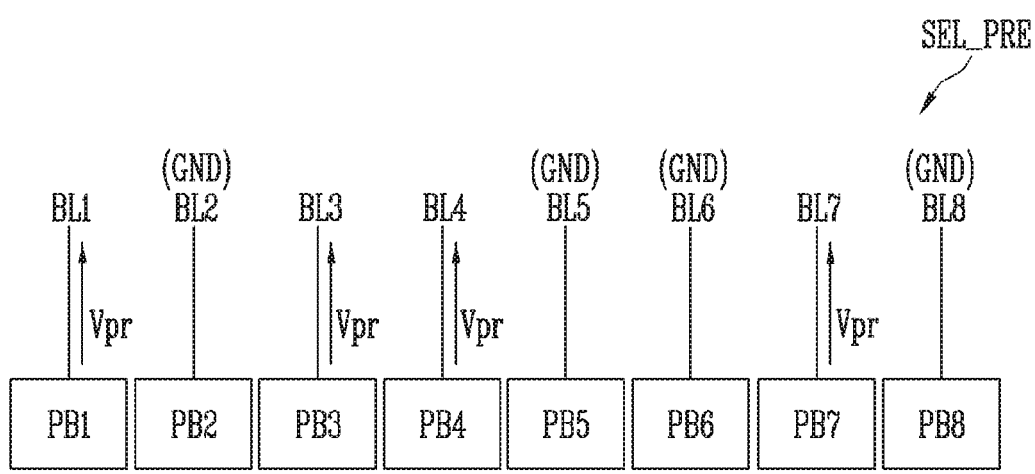

FIGS. 6 and 7 are diagrams illustrating a selective precharge operation SEL_PRE according to an embodiment of the present disclosure.

FIG. 6 illustrates a set up method of transmitting data stored in a first latch L1 to a sensing latch Ls during the selective precharge operation SEL_PRE and selectively precharging a first bit line BL1 depending on the data stored in the sensing latch Ls, and FIG. 7 illustrates an example in which bit lines are selectively precharged during the selective precharge operation SEL_PRE.

In order to easily describe the present embodiment, only components required for the selective precharge operation SEL_PRE, among the components of the first page buffer PB1 illustrated in FIG. 5, are briefly illustrated in FIG. 6.

Referring to FIG. 6, while a program operation is performed, data sensed during a previous verify operation may be input to the first latch L1. When the selective precharge operation SEL_PRE is performed during the verify operation, the data stored in the first latch L1 may be transmitted to the sensing latch Ls (61), and the selective precharge circuit SEL_PC may selectively apply a supply voltage VCC to the first bit line BL1 depending on the data stored in the sensing latch Ls (62). For example, when data loaded into the sensing latch node QS included in the sensing latch Ls is '1', the selective precharge circuit SEL_PC may transmit a precharge voltage Vpr having the level of the supply voltage VCC to the first bit line BL1. When the data loaded into the sensing latch node QS is '0', the selective precharge circuit SEL_PC might not output a precharge voltage Vpr, and the first bit line BL1 may be discharged by the discharge circuit DIS (63). For example, the potential of the discharged first bit line BL1 may have the level of the ground voltage GND.

Referring to FIG. 7, when the selective precharge operation SEL_PRE is performed in the state in which data '1' is stored in the sensing latches Ls of first, third, fourth, and seventh page buffers PB1, PB3, PB4, and PB7, among first to eighth page buffers PB1 to PB8, and data '0' is stored in the sensing latches Ls of the second, fifth, sixth, and eighth page buffers PB2, PB5, PB6, and PB8, the precharge voltage Vpr may be selectively applied only to the first, third, fourth, and seventh bit lines BL1, BL3, BL4, and BL7. That is, the precharge voltage Vpr may be applied to the first, third, fourth, and seventh bit lines BL1, BL3, BL4, and BL7 coupled to program target memory cells, and the ground voltage GND may be applied to the remaining bit lines, that is, the second, fifth, sixth, and eighth bit lines BL2, BL5, BL6, and BL8.

Since the selective precharge operation SEL_PRE selectively precharges the bit lines, current consumption in the selective precharge operation may be less than that in the non-selective precharge operation, but program operation time in the selective precharge operation may be longer than that in the non-selective precharge operation due to a set time during which data is transmitted to each latch.

Figure 8:
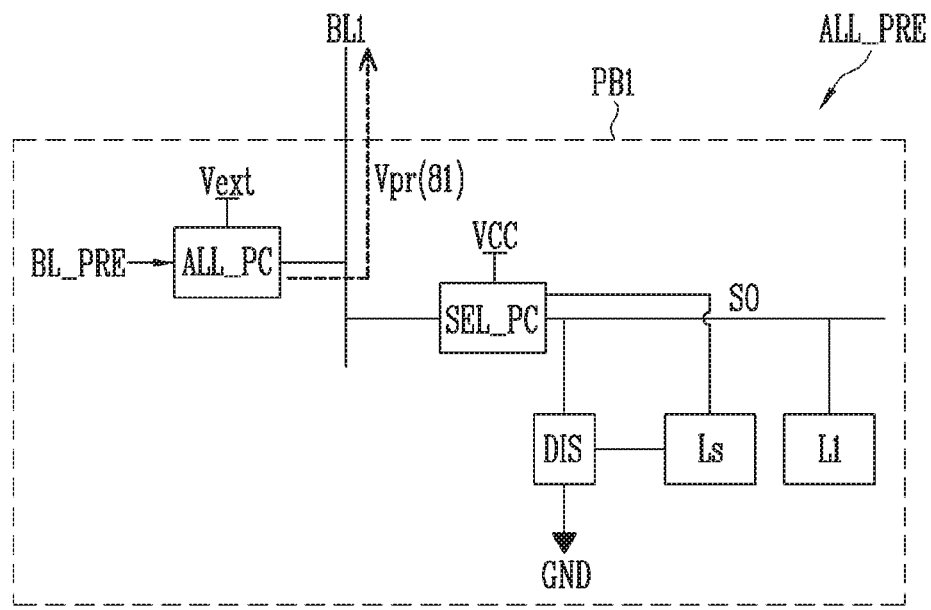
FIGS. 8 and 9 are diagrams illustrating a non-selective precharge operation according to an embodiment of the present disclosure.
Figure 9:
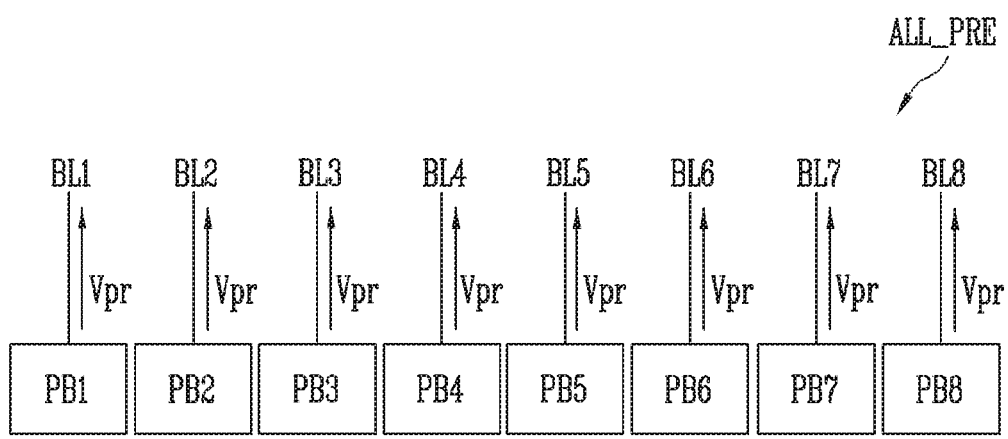

FIGS. 8 and 9 are diagrams illustrating a non-selective precharge operation according to an embodiment of the present disclosure.

FIG. 8 illustrates a method of precharging a first bit line BL1 using a non-selective precharge circuit ALL_PC during a non-selective precharge operation ALL_PRE, and FIG. 9 illustrates an example in which all bit lines are precharged during the non-selective precharge operation ALL_PRE.

In order to easily describe the present embodiment, in FIG. 8, only components required for the non-selective precharge operation ALL_PRE, among the components of the first page buffer PB1 illustrated in FIG. 5, are briefly illustrated.

Referring to FIG. 8, when the non-selective precharge operation ALL_PRE is performed during a verify operation, a bit line precharge signal BL_PRE may be enabled, and thus the non-selective precharge circuit ALL_PC may transmit a precharge voltage Vpr having the level of an external positive voltage Vext to a first bit line BL1 (81). During the non-selective precharge operation ALL_PRE, the non-selective precharge circuit ALL_PC may output the precharge voltage Vpr to the first bit line BL1 regardless of data stored in a sensing latch Ls.

Referring to FIG. 9, in the non-selective precharge operation ALL_PRE, bit lines are precharged using the non-selective precharge circuit ALL_PC regardless of data stored in page buffers, and thus the precharge voltage Vpr may be simultaneously applied to the first to eighth bit lines BL1 to BL8. That is, during the non-selective precharge operation ALL_PRE, all bit lines may be simultaneously precharged.

Since, in the non-selective precharge operation ALL_PRE, all bit lines are simultaneously precharged regardless of the data stored in the page buffers, operation time may be shorter than that in the selective precharge operation SEL_PRE, but current consumption may be greater than that in the selective precharge operation SEL_PRE.

As in the case of the above-described embodiments, when a verify voltage is applied to a selected word line after the selective precharge operation SEL_PRE or the non-selective precharge operation ALL_PRE has been performed, the voltages or currents of the bit lines may be maintained or changed. Therefore, a sensing operation may be performed as follows.

Figure 10:
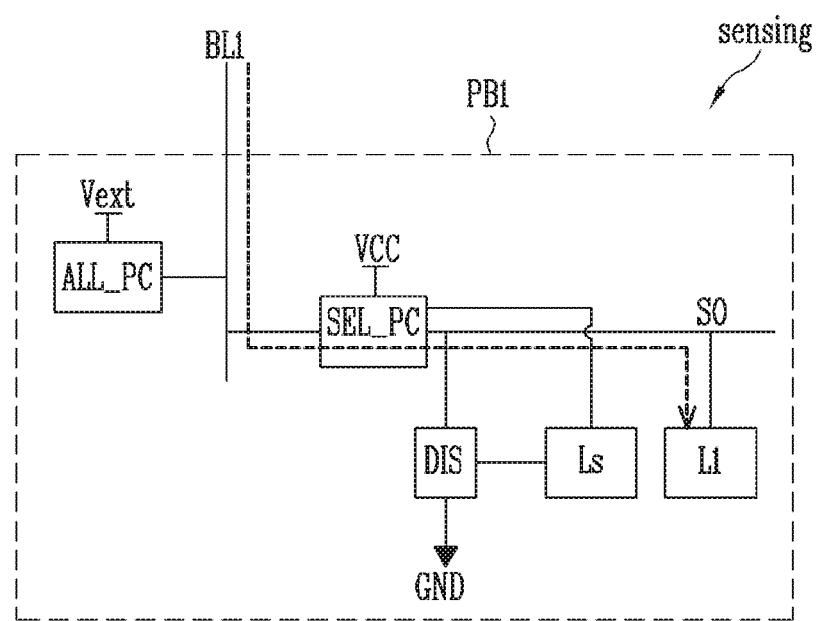
FIG. 10 is a diagram illustrating a sensing operation according to an embodiment of the present disclosure.

FIG. 10 is a diagram illustrating a sensing operation according to an embodiment of the present disclosure.

Referring to FIG. 10, when a sensing operation is performed, the voltage or current of a first bit line BL1 may be maintained in a precharge state or may be changed depending on the threshold voltage of a memory cell coupled to the first bit line BL1. For example, when the threshold voltage of the memory cell is higher than the verify voltage, the memory cell is turned off, and thus the first bit line BL1 may be maintained in a precharge state. When the threshold voltage of the memory cell is lower than the verify voltage, the memory cell is turned on, and thus the voltage of the first bit line BL1 may be decreased or the current thereof may be increased.

Data sensed depending on the voltage or current of the first bit line BL1 may be stored in the first latch L1.

Figure 11:
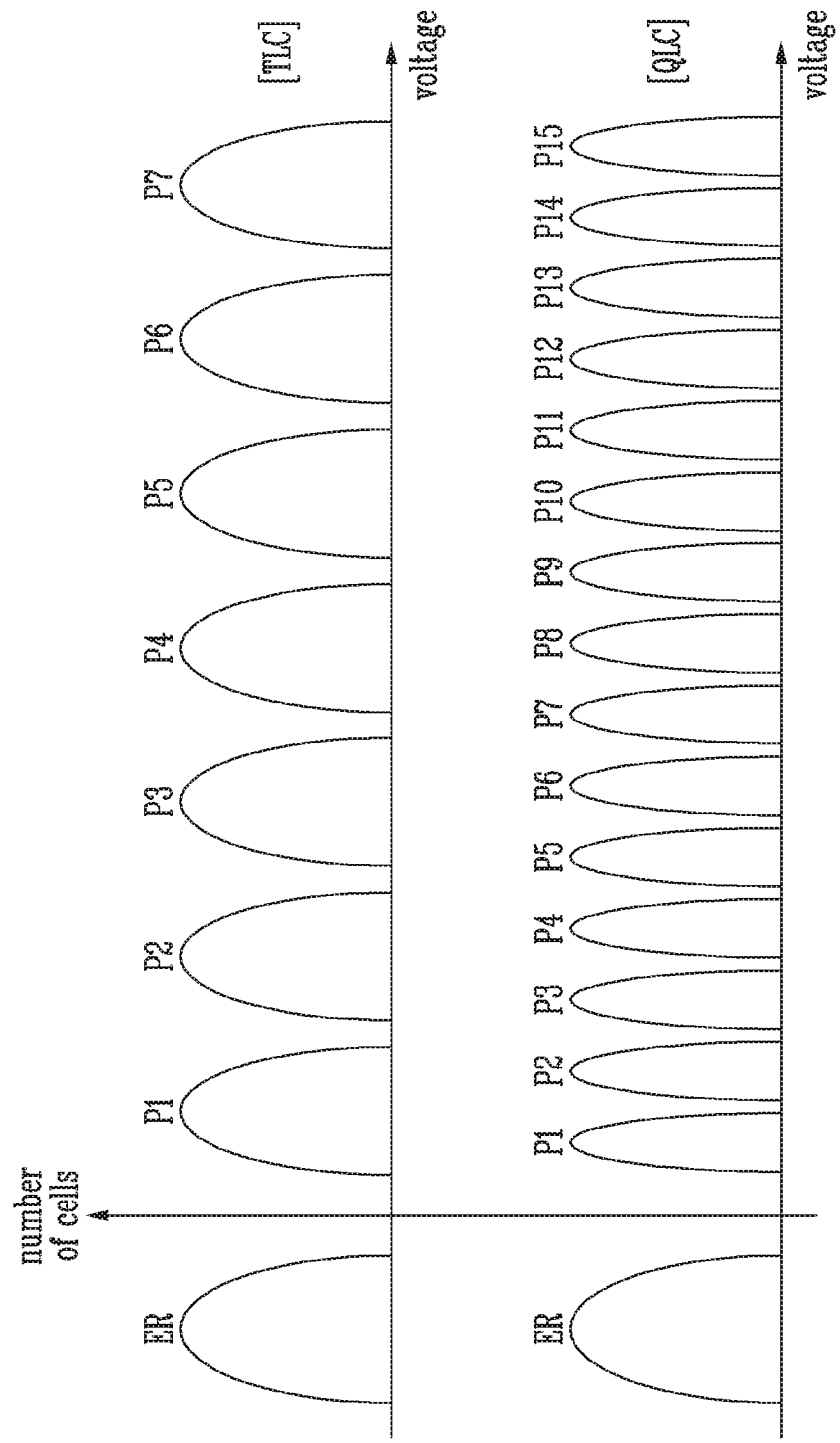
FIG. 11 is a diagram illustrating threshold voltages of memory cells.

FIG. 11 is a diagram illustrating the threshold voltages of memory cells.

Referring to FIG. 11, a program operation may be classified into various schemes depending on the number of bits stored in each memory cell. For example, a scheme in which three bits of data are stored in one memory cell is referred to as a triple-level cell (TLC) scheme, and a scheme in which four bits of data are stored in one memory cell is referred to as a quad-level cell (QLC) scheme.

In the TLC scheme, the state of each memory cell may be identified as one erased state ER or as any one of seven program states P1 to P7. In the QLC scheme, the state of each memory cell may be identified as one erased state ER or as any one of 15 program states P1 to P15.

The number of bits that can be stored in one memory cell is 5 or more, and the present embodiments do not limit the number of bits to be stored in each memory cell.

The more the number of data bits that can be stored in each memory cell, the more the number of verify voltages to be used in a verify operation. Accordingly, during the verify operation, a sensing operation for each of the plurality of verify voltages may be performed. A program operation will be described in detail as follows.

Figure 12:
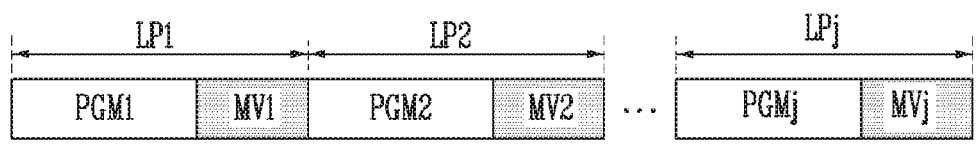
FIG. 12 is a diagram illustrating a plurality of loops included in a program operation.

FIG. 12 is a diagram illustrating a plurality of loops included in a program operation.

Referring to FIG. 12, a program operation on a selected page may be performed until all of the threshold voltages of selected memory cells included in the selected page reach target voltages. For example, in the program operation, first to j-th loops LP1 to LPj may be sequentially performed. In each loop, a sub-program operation and a main verify operation may be performed. The first loop LP1 is described below by way of example. During a first sub-program operation PGM1, a program voltage is applied to a selected word line, so that the threshold voltages of memory cells are increased. During a first main verify operation MV1, data of the memory cells may be sensed. Depending on the sensed data, the verify operation may pass or fail. For example, the first main verify operation MV1 may be performed after the first sub-program operation PGM1 has been performed in the first loop LP1. When the first main verify operation MV1 has failed, a second loop LP2 may be performed. In this way, the first to j-th loops LP1 to LPj may be sequentially performed until the verify operation passes.

Figure 13:
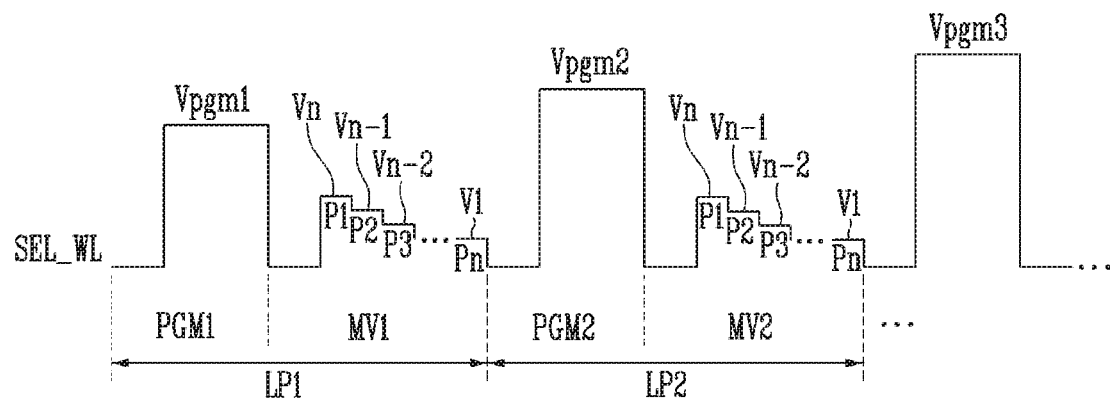
FIG. 13 is a diagram illustrating loops according to an embodiment of the present disclosure.

FIG. 13 is a diagram illustrating loops according to an embodiment of the present disclosure.

Referring to FIG. 13, a program operation may include a plurality of program loops LP1, LP2, . . . . The loops may be performed until the threshold voltages of selected memory cells reach target voltages. When a verify operation fails until the number of loops (i.e., loop count) that are performed reaches a threshold value, a selected memory block may be processed as a bad block.

Each loop may include a sub-program operation and a main verify operation. The first loop LP1 is described below by way of example. The first loop LP1 may include a first sub-program operation PGM1 and a first main verify operation MV1. During the first sub-program operation PGM1, a first program voltage Vpgm1 may be applied to a selected word line, and thus the threshold voltages of memory cells may be increased.

During the first main verify operation MV1, the plurality of sub-verify operations P1 to Pn may be sequentially performed depending on the number of verify voltages. For example, when first to n-th verify voltages V1 to Vn are used in the first loop LP1, verify voltages decreased in stages from the highest n-th verify voltage Vn may be sequentially used in the first main verify operation MV1. For example, when the first main verify operation MV1 is started, the n-th verify voltage Vn may be used in the first sub-verify operation P1, and an n−1-th verify voltage Vn−1 lower than the n-th verify voltage Vn may be used in the second sub-verify operation P2. In this way, in the n-th sub-verify operation Pn, the lowest first verify voltage V1 may be used. When a failed verify operation is detected among the first to n-th sub-verify operations P1 to Pn, the second loop LP2 may be performed.

In the second loop LP2, a second sub-program operation PGM2 and a second main verify operation MV2 may be performed. During the second sub-program operation PGM2, a second program voltage Vpgm2 higher than the first program voltage Vpgm1 by a step voltage may be used. The second main verify operation MV2 may be performed in the same manner as the first main verify operation MV1. Alternatively, when a passed sub-verify operation is detected in the first main verify operation MV1, the passed sub-verify operation may be omitted during the second main verify operation MV2.

Figure 14:
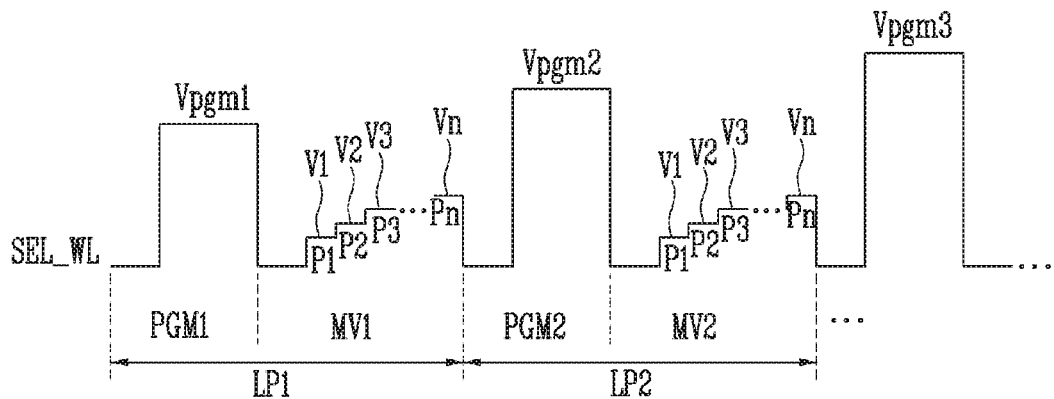
FIG. 14 is a diagram illustrating loops according to an embodiment of the present disclosure.

FIG. 14 is a diagram illustrating loops according to an embodiment of the present disclosure.

Referring to FIG. 14, a program operation may include a plurality of program loops LP1, LP2, . . . . The loops may be performed until the threshold voltages of selected memory cells reach target voltages. When a verify operation fails until the number of loops that are performed reaches a threshold value, a selected memory block may be processed as a bad block.

Each loop may include a sub-program operation and a main verify operation. The first loop LP1 is described below by way of example. The first loop LP1 may include a first sub-program operation PGM1 and a first main verify operation MV1. During the first sub-program operation PGM1, a first program voltage Vpgm1 may be applied to a selected word line, and thus the threshold voltages of memory cells may be increased.

During the first main verify operation MPV1, the plurality of sub-verify operations P1 to Pn may be sequentially performed depending on the number of verify voltages. For example, when first to n-th verify voltages V1 to Vn are used in the first loop LP1, verify voltages increased in stages from the lowest first verify voltage V1 may be sequentially used in the first main verify operation MV1. For example, when the first main verify operation MV1 is started, the first verify voltage V1 may be used in the first sub-verify operation P1, and the second verify voltage V2 higher than the first verify voltage V1 may be used in the second sub-verify operation P2. In this way, the highest n-th verify voltage Vn may be used in the n-th sub-verify operation Pn. When a failed verify operation is detected among the first to n-th sub-verify operations P1 to Pn, the second loop LP2 may be performed.

In the second loop LP2, a second sub-program operation PGM2 and a second main verify operation MV2 may be performed. During the second sub-program operation PGM2, a second program voltage Vpgm2 higher than the first program voltage Vpgm1 by a step voltage may be used. The second main verify operation MV2 may be performed in the same manner as the first main verify operation MV1. Alternatively, when a passed sub-verify operation is detected in the first main verify operation MV1, the passed sub-verify operation may be omitted during the second main verify operation MV2.

Figure 15:
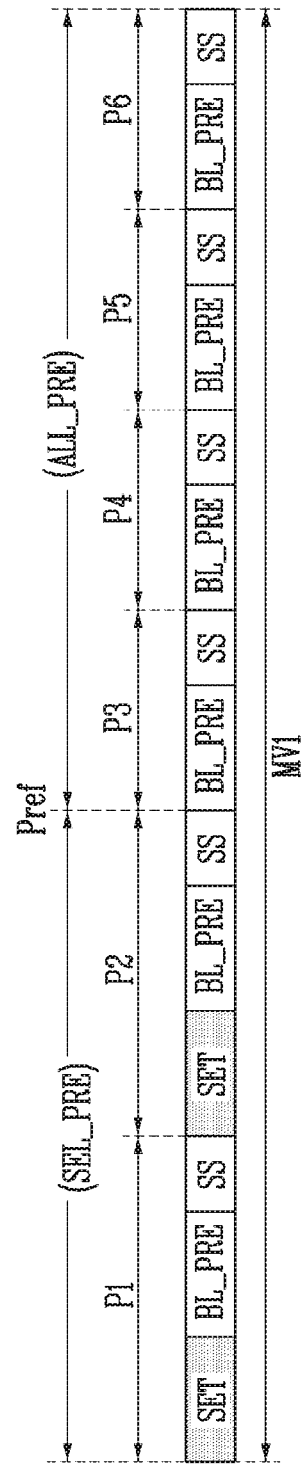
FIG. 15 is a diagram illustrating a verify operation according to first embodiments of the present disclosure.

FIG. 15 is a diagram illustrating a verify operation according to first embodiments of the present disclosure.

Referring to FIG. 15, during some of sub-verify operations performed in the same main verify operation, bit lines may be precharged using a selective precharge scheme, and during the remaining sub-verify operations, bit lines may be precharged using a non-selective precharge scheme. For example, when first to sixth sub-verify operations P1 to P6 are sequentially performed during the first main verify operation MV1, bit lines may be selectively precharged based on a selective precharge operation SEL_PRE during some sub-verify operations corresponding to an early stage, among the first to sixth sub-verify operations P1 to P6, the bit lines, and the threshold voltages of memory cells coupled to the selectively precharged bit lines may be verified. Then, during the remaining sub-verify operations, all bit lines may be simultaneously precharged based on a non-selective precharge operation ALL_PRE, and the threshold voltages of memory cells coupled to all precharged bit lines may be verified. In order to distinguish the step of performing the selective precharge operation SEL_PRE from the step of performing the non-selective precharge operation ALL_PRE, the reference number of verify operations Pref may be set. The reference number of verify operations Pref may be the number of sub-verify operations performed in the same main verify operation. Alternatively, the reference number of verify operations Pref may be the number of verify voltages changed in the same main verify operation. Therefore, the reference number of verify operations Pref may be set to a positive integer of 1 or more.

For example, when the reference number of verify operations Pref is set to 2 based on the number of sub-verify operations, the selective precharge operation SEL_PRE may be performed during first and second sub-verify operations P1 and P2 which are within the range of 2 (i.e., twice), and the non-selective precharge operation ALL_PRE may be performed during the remaining third to sixth sub-verify operations P3 to P6.

During the first and second sub-verify operations P1 and P2 in which the selective precharge operation SEL_PRE is performed, the bit lines may be selectively precharged depending on the data input to the latches of page buffers, and a sensing operation on the selected memory cells may be performed when the bit lines are selectively precharged. For example, during the first sub-verify operation P1, a setup operation SET of selectively setting up data in the latches of page buffers to select bit lines to be precharged, a precharge operation BL_PRE of selectively precharging the bit lines depending on the setup data of the latches, and a sensing operation SS of sensing the voltages or currents of memory cells may be performed. Even during the second sub-verify operation P2, the selective precharge operation SEL_PRE is performed, and thus the setup operation SET, the precharge operation BL_PRE, and the sensing operation SS may be sequentially performed.

During the third to sixth sub-verify operations P3 to P6 in which the non-selective precharge operation ALL_PRE is performed, all bit lines may be simultaneously precharged using a non-selective precharge circuit (e.g., ALL_PC of FIG. 5). For example, during the third sub-verify operation P3, a precharge operation BL_PRE of simultaneously precharging all bit lines and a sensing operation SS of sensing the voltages or currents of memory cells may be sequentially performed. During the third to sixth sub-verify operations P3 to P6, all bit lines are precharged using the non-selective precharge circuit ALL_PC, and thus the setup operation SET is omitted.

Although the first main verify operation MV1 is illustrated in FIG. 15 as an embodiment, the selective precharge operation SEL_PRE may be performed, after which the non-selective precharge operation ALL_PRE may be performed, even during the remaining main verify operations while the program operation is performed on a selected page.

Figure 16:
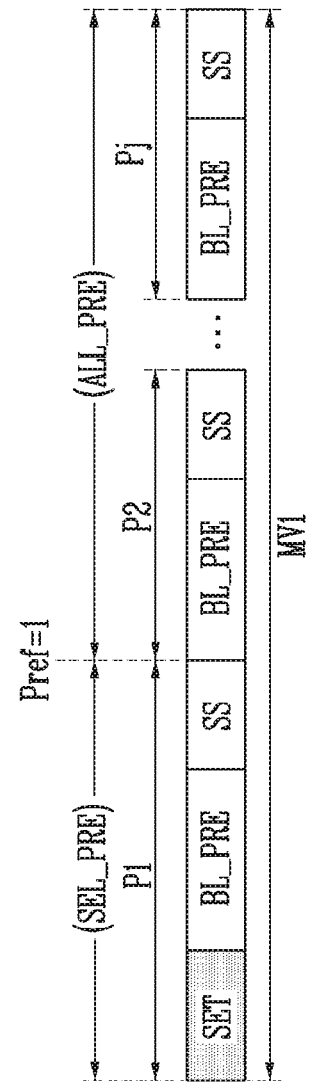
FIG. 16 is a diagram illustrating a verify operation according to second embodiments of the present disclosure.

FIG. 16 is a diagram illustrating a verify operation according to second embodiments of the present disclosure.

Referring to FIG. 16, when the reference number of verify operations Pref is set to '1', a selective precharge operation SEL_PRE may be performed only during a first sub-verify operation P1, among first to j-th sub-verify operations P1 to Pj that are performed in a first main verify operation MV1, and a non-selective precharge operation ALL_PRE may be performed during the remaining second to j-th sub-verify operations P2 to Pj.

During the first sub-verify operation P1 in which the selective precharge operation SEL_PRE is performed, bit lines may be selectively precharged depending on data input to the latches of page buffers. When the bit lines are selectively precharged, a sensing operation on selected memory cells may be performed. For example, during the first sub-verify operation P1, a setup operation SET of selectively setting up data in the latches of page buffers to select bit lines to be precharged, a precharge operation BL_PRE of selectively precharging the bit lines depending on the setup data of the latches, and a sensing operation SS of sensing the voltages or currents of memory cells may be performed.

During the second to j-th sub-verify operations P2 to Pj in which the non-selective precharge operation ALL_PRE is performed, all bit lines may be simultaneously precharged using a non-selective precharge circuit (e.g., ALL_PC of FIG. 5). For example, during the second sub-verify operation P2, a precharge operation BL_PRE of simultaneously precharging all bit lines and a sensing operation SS of sensing the voltages or currents of memory cells may be sequentially performed. During the second to j-th sub-verify operations P2 to Pj, all bit lines are precharged using the non-selective precharge circuit ALL_PC, and thus the setup operation SET is omitted.

Although the first main verify operation MV1 is illustrated in FIG. 16 as an embodiment, the selective precharge operation SEL_PRE may be performed, after which the non-selective precharge operation ALL_PRE may be performed, even during the remaining main verify operations while the program operation is performed on a selected page.

Figure 17:
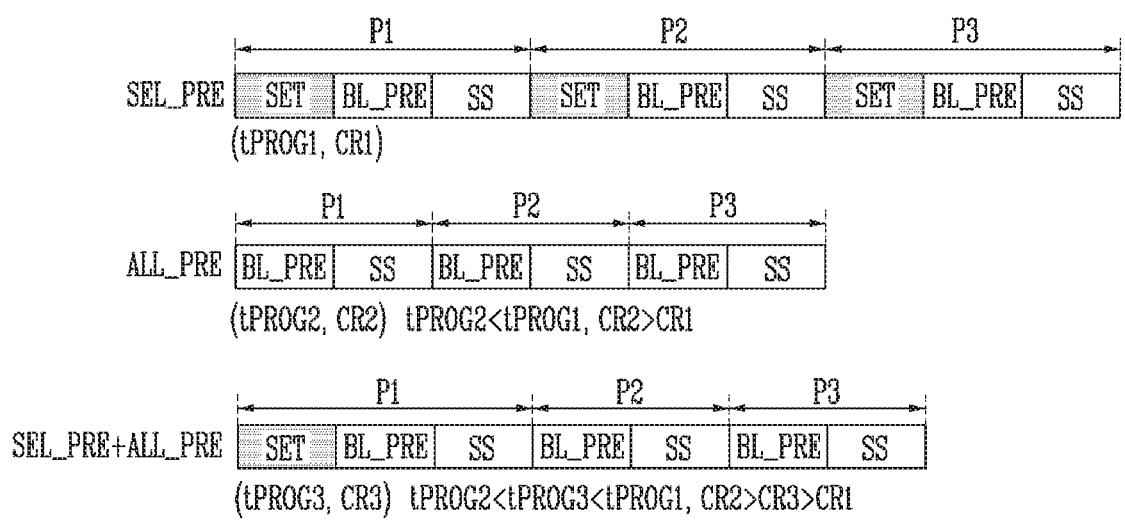
FIG. 17 is a diagram illustrating the effect of the program operation according to the first or second embodiments of the present disclosure.

FIG. 17 is a diagram illustrating the effect of the program operation according to the first or second embodiments of the present disclosure.

Referring to FIG. 17, the selective precharge operation SEL_PRE and the non-selective precharge operation ALL_PRE may include in common a precharge operation BL_PRE and a sensing operation SS, but the selective precharge operation SEL_PRE further includes a setup operation SET.

It is assumed that operation time required for a program operation, during which first to third sub-verify operations P1 to P3 are performed only based on the selective precharge operation SEL_PRE, is first program operation time tPROG1 and that current consumption at this time is first current consumption CR1.

Assuming that operation time required for a program operation, during which the first to third sub-verify operations P1 to P3 are performed only based on the non-selective precharge operation ALL_PRE, is second program operation time tPROG2, and that current consumption at this time is second current consumption CR2, the second program operation time tPROG2 may be shorter than the first program operation time tPROG1, and the second current consumption CR2 may be greater than the first current consumption CR1.

As in the case of the present embodiment, assuming that operation time required for a program operation, during which the selective precharge operation SEL_PRE and the non-selective precharge operation ALL_PRE coexist, is third program operation time tPROG3 and that current consumption at this time is third current consumption CR3, the third program operation time tPROG3 may be longer than the second program operation time tPROG2 and shorter than the first program operation time tPROG1. The third current consumption CR3 may be less than the second current consumption CR2 and greater than the first current consumption CR1.

That is, in the present embodiment, the selective precharge operation SEL_PRE and the non-selective precharge operation ALL_PRE may be controlled by adjusting the reference number of verify operations Pref, and thus performance of the memory device may be improved by controlling the time required for the program operation of the memory device and current consumption occurring in the program operation.

FIG. 18 is a diagram illustrating a verify operation according to third embodiments of the present disclosure.

Referring to FIG. 18, during some of sub-verify operations performed in the same main verify operation, bit lines may be precharged using a selective precharge scheme, and during the remaining sub-verify operations, bit lines may be precharged using a non-selective precharge scheme. For example, when sixth to first sub-verify operations P6 to P1 are sequentially performed during the first main verify operation MV1, bit lines may be selectively precharged based on a selective precharge operation SEL_PRE during some sub-verify operations corresponding to an early stage, among the sixth to first sub-verify operations P6 to P1, the bit lines, and the threshold voltages of memory cells coupled to the selectively precharged bit lines may be verified. The sixth sub-verify operation P6 may be an operation of verifying memory cells having the highest target voltage and the first sub-verify operation P1 may be an operation of verifying memory cells having the lowest target voltage. Then, during the remaining sub-verify operations, all bit lines may be simultaneously precharged based on a non-selective precharge operation ALL_PRE, and the threshold voltages of memory cells coupled to all precharged bit lines may be verified. In order to distinguish the step of performing the selective precharge operation SEL_PRE from the step of performing the non-selective precharge operation ALL_PRE, the reference number of verify operations Pref may be set. The reference number of verify operations Pref may be the number of sub-verify operations performed in the same main verify operation. Alternatively, the reference number of verify operations Pref may be the number of verify voltages changed during the same main verify operation. Therefore, the reference number of verify operations Pref may be set to a positive integer of 1 or more.

For example, when the reference number of verify operations Pref is set to 2 based on the number of sub-verify operations, the selective precharge operation SEL_PRE may be performed during sixth and fifth sub-verify operations P6 and P5, which are within the range of 2 (i.e., twice), and the non-selective precharge operation ALL_PRE may be performed during the remaining fourth to first sub-verify operations P4 to P1.

During the sixth and fifth sub-verify operations P6 and P5 in which the selective precharge operation SEL_PRE is performed, the bit lines may be selectively precharged depending on the data input to the latches of page buffers, and a sensing operation on the selected memory cells may be performed when the bit lines are selectively precharged. For example, during the sixth sub-verify operation P6, a setup operation SET of selectively setting up data in the latches of page buffers to select bit lines to be precharged, a precharge operation BL_PRE of selectively precharging the bit lines depending on the setup data of the latches, and a sensing operation SS of sensing the voltages or currents of memory cells may be performed. Even during the fifth sub-verify operation P5, the selective precharge operation SEL_PRE is performed, and thus the setup operation SET, the precharge operation BL_PRE, and the sensing operation SS may be sequentially performed.

During the fourth to first sub-verify operations P4 to P1 in which the non-selective precharge operation ALL_PRE is performed, all bit lines may be simultaneously precharged using a non-selective precharge circuit (e.g., ALL_PC of FIG. 5). For example, during the fourth sub-verify operation P4, a precharge operation BL_PRE of simultaneously precharging all bit lines and a sensing operation SS of sensing the voltages or currents of memory cells may be sequentially performed. During the fourth to first sub-verify operations P4 to P1, all bit lines are precharged using the non-selective precharge circuit ALL_PC, and thus the setup operation SET may be omitted.

Although the first main verify operation MV1 is illustrated in FIG. 18 as an embodiment, the selective precharge operation SEL_PRE may be performed, after which the non-selective precharge operation ALL_PRE may be performed, even during the remaining main verify operations while the program operation is performed on a selected page.

FIG. 19 is a diagram illustrating a verify operation according to fourth embodiments of the present disclosure.

Referring to FIG. 19, when the reference number of verify operations Pref is set to '1', a selective precharge operation SEL_PRE may be performed only during a j-th sub-verify operation Pj, among j-th to first sub-verify operations Pj to P1 that are performed in a first main verify operation MV1, and a non-selective precharge operation ALL_PRE may be performed during the remaining sub-verify operations, that is, j–1-th to first sub-verify operations Pj–1 to P1.

During the j-th sub-verify operation Pj in which the selective precharge operation SEL_PRE is performed, bit lines may be selectively precharged depending on data input to the latches of page buffers. When the bit lines are selectively precharged, a sensing operation on selected memory cells may be performed. For example, during the j-th sub-verify operation Pj, a setup operation SET of selectively setting up data in the latches of page buffers to select bit lines to be precharged, a precharge operation BL_PRE of selectively precharging the bit lines depending on the setup data of the latches, and a sensing operation SS of sensing the voltages or currents of memory cells may be performed.

During the j–1-th to first sub-verify operations Pj–1 to P1 in which the non-selective precharge operation ALL_PRE is performed, all bit lines may be simultaneously precharged using a non-selective precharge circuit (e.g., ALL_PC of FIG. 5). For example, during the j–1-th sub-verify operation Pj–1, a precharge operation BL_PRE of simultaneously precharging all bit lines and a sensing operation SS of sensing the voltages or currents of memory cells may be sequentially performed. During the j–1-th to first sub-verify operations Pj–1 to P1, all bit lines are precharged using the non-selective precharge circuit ALL_PC, and thus the setup operation SET is omitted.

Although the first main verify operation MV1 is illustrated in FIG. 19 as an embodiment, the selective precharge operation SEL_PRE may be performed, after which the non-selective precharge operation ALL_PRE may be performed, even during the remaining main verify operations while the program operation is performed on a selected page.

Figure 20:
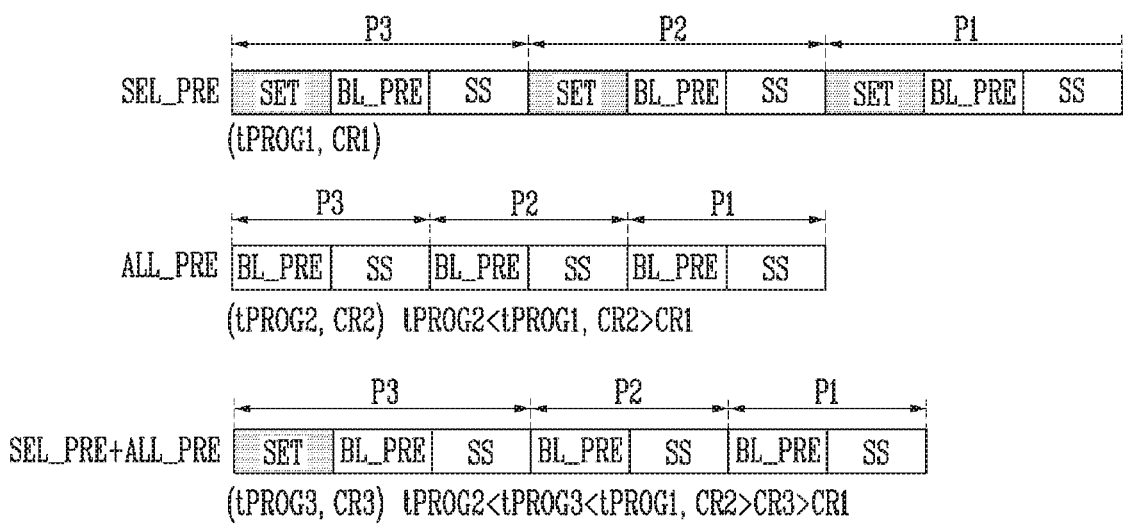
FIG. 20 is a diagram illustrating the effect of the program operation according to the third or fourth embodiments of the present disclosure.

FIG. 20 is a diagram illustrating the effect of the program operation according to the third or fourth embodiments of the present disclosure.

Referring to FIG. 20, the selective precharge operation SEL_PRE and the non-selective precharge operation ALL_PRE may include in common a precharge operation BL_PRE and a sensing operation SS, but the selective precharge operation SEL_PRE further includes a setup operation SET.

It is assumed that operation time required for a program operation, during which third to first sub-verify operations P3 to P1 are performed only based on the selective precharge operation SEL_PRE, is first program operation time tPROG1 and that current consumption at this time is first current consumption CR1.

Assuming that operation time required for a program operation, during which the third to first sub-verify operations P3 to P1 are performed only based on the non-selective precharge operation ALL_PRE, is second program operation time tPROG2, and that current consumption at this time is second current consumption CR2, the second program operation time tPROG2 may be shorter than the first program operation time tPROG1, and the second current consumption CR2 may be greater than the first current consumption CR1.

As in the case of the present embodiment, assuming that operation time required for a program operation, during which the selective precharge operation SEL_PRE and the non-selective precharge operation ALL_PRE coexist, is third program operation time tPROG3 and that current consumption at this time is third current consumption CR3, the third program operation time tPROG3 may be longer than the second program operation time tPROG2 and shorter than the first program operation time tPROG1. The third current consumption CR3 may be less than the second current consumption CR2 and greater than the first current consumption CR1.

That is, in the present embodiment, the selective precharge operation SEL_PRE and the non-selective precharge operation ALL_PRE may be controlled by adjusting the reference number of verify operations Pref, and thus performance of the memory device may be improved by controlling the time required for the program operation of the memory device and current consumption occurring in the program operation.

Figure 21:
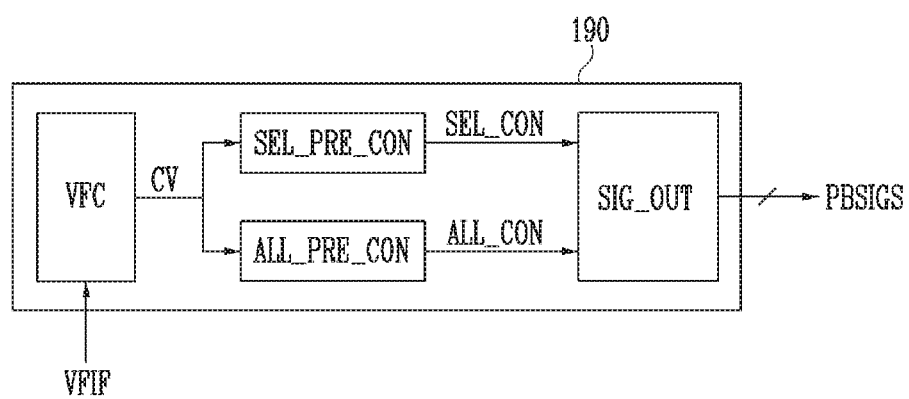
FIG. 21 is a diagram illustrating a page buffer controller according to an embodiment of the present disclosure.

FIG. 21 is a diagram illustrating a page buffer controller according to an embodiment of the present disclosure.

Referring to FIG. 21, a page buffer controller 190 may include a verify counter VFC, a selective precharge controller SEL_PRE_CON, a non-selective precharge controller ALL_PRE_CON, and a signal output circuit SIG_OUT.

The verify counter VFC may count the number of sub-verify operations based on verify information VFIF, and may output a count value CV. The verify information VFIF may include information about the number of loops (i.e., loop count) that are performed during a program operation and information about a change in a verify voltage. Whenever, of the information, the verify voltage change information is changed, the number of sub-verify operations may be counted. Whenever a loop count is increased, the count value may be initialized. That is, since the sub-verify operation is performed whenever a verify voltage applied to a selected word line is changed, the verify counter VFC may output the count value CV based on the verify voltage change information included in the verify information VFIF. Since a selective precharge operation and a non-selective precharge operation are repeatedly performed in respective loops, the verify counter VFC may reset the count value CV to '0' when the loop count is changed.

The selective precharge controller SEL_PRE_CON and the non-selective precharge controller ALL_PRE_CON may simultaneously receive the count value CV, and may individually compare the count value CV with the reference number of verify operations. During the verify operation, when the selective precharge controller SEL_PRE_CON is activated, the non-selective precharge controller ALL_PRE_CON may be deactivated, whereas when the non-selective precharge controller ALL_PRE_CON is activated, the selective precharge controller SEL_PRE_CON may be deactivated. For example, the selective precharge controller SEL_PRE_CON may be activated when the count value CV is less than or equal to the reference number of verify operations. The non-selective precharge controller ALL_PRE_CON may be activated when the count value CV is greater than the reference number of verify operations.

The activated selective precharge controller SEL_PRE_CON may output a selective control signal SEL_CON, and the activated non-selective precharge controller ALL_PRE_CON may output a non-selective control signal ALL_CON.

The signal output circuit SIG_OUT may output page buffer control signals PBSIGS in response to the selective control signal SEL_CON or the non-selective control signal ALL_CON. For example, the signal output circuit SIG_OUT may output the page buffer control signals PBSIGS so that a selective precharge operation is performed in response to the selective control signal SEL_CON, and may output the page buffer control signals PBSIGS so that a non-selective precharge operation is performed in response to the non-selective control signal ALL_CON.

Figure 22:
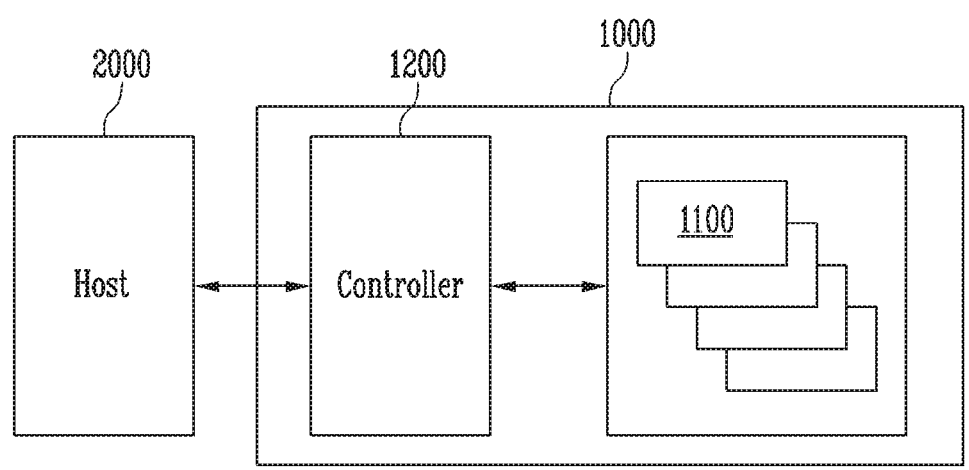
FIG. 22 is a diagram illustrating a memory system including a memory device according to an embodiment of the present disclosure.

FIG. 22 is a diagram illustrating a memory system including a memory device according to the present disclosure.

Referring to FIG. 22, a memory system 1000 may include a memory device 1100 which stores data, and a controller 1200 which performs communication between the memory device 1100 and a host 2000.

The memory device 1100 may be configured using the memory devices 1100 illustrated in FIG. 1.

The memory system 1000 may include a plurality of memory devices 1100, each of which may be coupled to the controller 1200 through at least one channel. For example, the plurality of memory devices 1100 may be coupled to one channel. Even if a plurality of channels are coupled to the controller 1200, the plurality of memory devices 1100 may be coupled to respective channels.

The controller 1200 may perform communication between the host 2000 and the memory devices 1100. The controller 1200 may control the memory devices 1100 in response to a request from the host 2000, or may perform a background operation for improving the performance of the memory system 1000 regardless of a request from the host 2000. The host 2000 may generate requests for various operations, and may output the generated requests to the memory system 1000. For example, the requests may include a program request for controlling a program operation, a read request for controlling a read operation, an erase request for controlling an erase operation, etc.

The host 2000 may communicate with the memory system 1000 through various interfaces, such as Peripheral Component Interconnect Express (PCIe), Advanced Technology Attachment (ATA), Serial ATA (SATA), Parallel ATA (PATA), serial attached SCSI (SAS), Non-Volatile Memory Express (NVMe), Universal Serial Bus (USB), Multi-Media Card (MMC), Enhanced Small Disk Interface (ESDI), or Integrated Drive Electronics (IDE).

Figure 23:
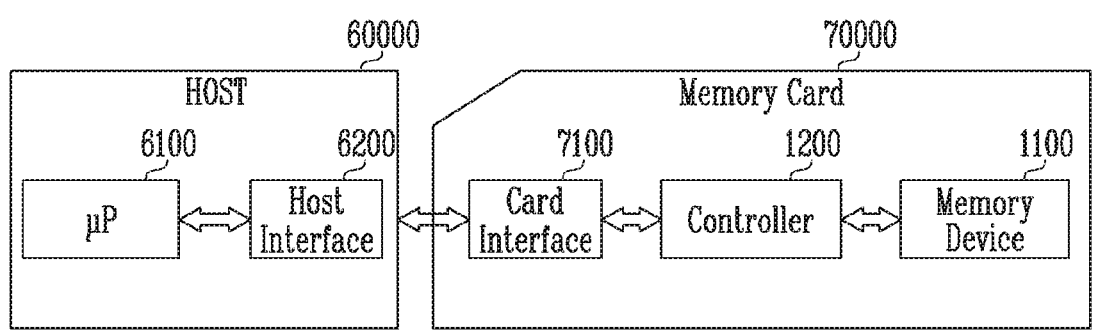
FIG. 23 is a diagram illustrating a memory system including a memory device according to an embodiment of the present disclosure.

FIG. 23 is a diagram illustrating a memory system including a memory device according to the present disclosure.

Referring to FIG. 23, a memory system 70000 may be implemented as a memory card or a smart card. The memory system 70000 may include a memory device 1100, a controller 1200, and a card interface 7100.

The memory device 1100 may be configured using the memory devices 1100 illustrated in FIG. 1.

The controller 1200 may control data exchange between the memory device 1100 and the card interface 7100. In an embodiment, the card interface 7100 may be, but is not limited to, a secure digital (SD) card interface or a multi-media card (MMC) interface.

The card interface 7100 may interface data exchange between a host 60000 and the controller 1200 according to a protocol of the host 60000. In an embodiment, the card interface 7100 may support a universal serial bus (USB) protocol and an interchip (IC)-USB protocol. Here, the card interface 7100 may refer to hardware capable of supporting a protocol which is used by the host 60000, software installed in the hardware, or a signal transmission method performed by the hardware.

When the memory system 70000 is coupled to a host interface 6200 of the host 60000 such as a PC, a tablet PC, a digital camera, a digital audio player, a mobile phone, console video game hardware or a digital set-top box, the host interface 6200 may perform is data communication with the memory device 1100 through the card interface 7100 and the controller 1200 under the control of a microprocessor (μP) 6100.

The present disclosure may shorten program operation time and reduce current consumption during a program operation of a memory device, thus improving performance of the memory device.

What is claimed is:

1. A memory device, comprising:
a memory block coupled to bit lines and word lines, the memory block includes a plurality of memory cells;
a voltage generator configured to apply at least one of a program voltage and a verify voltage to a word line selected from among the word lines;
page buffers configured to precharge part or all of the bit lines during a sub verify operation performed on the memory cells;
an operation logic configured to output verify information related to a verify operation performed during a program operation in response to a command; and
a page buffer controller configured to output page buffer control signals so that the part or all of the bit lines are precharged depending on the verify information.

2. The memory device according to claim 1, wherein each of the page buffers comprises:
a non-selective precharge circuit configured to precharge a corresponding bit line to a positive voltage;
a sensing latch configured to store sensed data;
a selective precharge circuit configured to selectively precharge the corresponding bit line depending on the sensed data stored in the sensing latch; and
a discharge circuit configured to selectively discharge the corresponding bit line depending on the sensed data stored in the sensing latch.

3. The memory device according to claim 2, wherein the non-selective precharge circuit comprises:
a switch configured to transmit an external positive voltage to the corresponding bit line in response to a bit line precharge signal included in the page buffer control signals.

4. The memory device according to claim 2, wherein the non-selective precharge circuit is deactivated when at least one of the selective precharge circuit and the discharge circuit is activated.

5. The memory device according to claim 2, wherein, when the selective precharge circuit is activated, the sensed data is stored in the sensing latch.

6. The memory device according to claim 1, wherein the page buffer controller comprises:
a verify counter configured to output a count value obtained by counting a number of sub-verify operations in response to the verify information;
a selective precharge controller configured to compare the count value with a reference number of verify operations and output a selective control signal when the count value is less than or equal to the reference number of verify operations;
a non-selective precharge controller configured to compare the count value with the reference number of verify operations and output a non-selective control signal when the count value is greater than the reference number of verify operations; and
a signal output circuit configured to output the page buffer control signals so that a selective precharge operation is performed in response to the selective control signal or a non-selective precharge operation is performed in response to the non-selective control signal.

7. A method of operating a memory device, comprising:
increasing threshold voltages of memory cells; and performing a main verify operation of verifying the memory cells, wherein the main verify operation includes a plurality of sub-verify operations that use different verify voltages, and wherein, during sub-verify operations having an order which is within a range of the reference number of verify operations, among the sub-verify operations, bit lines are selectively precharged and then a sensing operation is performed, and during sub-verify operations having an order which is greater than or less than the range of the reference number of verify operations, all of the bit lines are precharged and then the sensing operation is performed.

8. The method according to claim 7, wherein increasing the threshold voltages of the memory cells increases a program voltage to be applied to a word line coupled to the memory cells.

9. The method according to claim 7, wherein the plurality of sub-verify operations are sequentially performed using verify voltages that are decreased in stages from a verify voltage having a highest level.

10. The method according to claim 7, wherein the plurality of sub-verify operations are sequentially performed using verify voltages that are increased in stages from a verify voltage having a lowest level.

11. The method according to claim 7, wherein selectively precharging the bit lines and then performing the sensing operation comprises:

setting up sensing latches in page buffers coupled to the bit lines by transferring sensed data stored in first latches to the sensing latches, wherein the sensed data is stored in the first latches when a previous verify operation is performed;

selectively precharging the bit lines depending on data stored in the page buffers; and sensing voltages or currents of the bit lines by applying a verify voltage selected from among the verify voltages to a word line coupled to the memory cells.

12. The method according to claim 11, wherein selectively precharging the bit lines is configured such that:

bit lines coupled to program target memory cells, among the memory cells, are precharged, and a ground voltage is applied to remaining bit lines.

13. The method according to claim 7, wherein precharging all of the bit lines and then performing the sensing operation comprises:

precharging all of the bit lines regardless of data stored in the page buffers; and sensing voltages or currents of the bit lines by applying a verify voltage selected from among the verify voltages to a word line coupled to the memory cells.

14. The method according to claim 7, wherein the reference number of verify operations is set to a positive integer of 1 or more.

15. A method of operating a memory device, comprising:

performing a first sub-verify operation of selectively precharging bit lines depending on data stored in page buffers and of verifying threshold voltages of memory cells; and performing a second sub-verify operation of simultaneously precharging the bit lines regardless of the data stored in the page buffers and of verifying threshold voltages of the memory cells.

16. The method according to claim 15, wherein the first sub-verify operation and the second sub-verify operation are performed using different verify voltages.

17. The method according to claim 16, wherein:

the first sub-verify operation is performed using a first verify voltage, and the second sub-verify operation is performed using a second verify voltage lower than the first verify voltage.

18. The method according to claim 15, wherein performing the first sub-verify operation comprises:

setting up sensing latches included in the page buffers by transferring sensed data stored in first latches to the sensing latches, wherein the sensed data is stored in the first latches when a previous verify operation is performed;

applying one of a precharge voltage and a ground voltage to the bit lines depending on data stored in the sensing latches coupled to the bit lines; and sensing threshold voltages of the memory cells by applying a verify voltage to a word line coupled to the memory cells.

19. The method according to claim 15, wherein performing the second sub-verify operation comprises:

applying a precharge voltage to all of the bit lines regardless of data stored in the page buffers; and sensing threshold voltages of the memory cells by applying a verify voltage to a word line coupled to the memory cells.

* * * * *